United States Patent
Sanchihar et al.

(10) Patent No.: US 10,446,310 B2
(45) Date of Patent: Oct. 15, 2019

(54) LINEAR VARIABLE DISPLACEMENT TRANSFORMER (LVDT) WITH IMPROVED LINEARITY USING EXTREME END BOOSTER WINDING

(71) Applicant: Honeywell International Inc., Morris Plains, NJ (US)

(72) Inventors: Paresh Sanchihar, Bangalore (IN); Murgesh R. Sajjan, Bangalore (IN); Subramanian Esakki, Bangalore (IN); Aaron Daniels, Echo, MI (US); John Jerred, East Jordan, MI (US)

(73) Assignee: Honeywell International Inc., Morris Plains, NJ (US)

( * ) Notice: Subject to any disclaimer, the term of this patent is extended or adjusted under 35 U.S.C. 154(b) by 177 days.

(21) Appl. No.: 15/169,923

(22) Filed: Jun. 1, 2016

(65) Prior Publication Data
US 2017/0352464 A1    Dec. 7, 2017

(51) Int. Cl.
*H01F 21/02* (2006.01)
*H01F 21/06* (2006.01)
*G01D 5/22* (2006.01)
*G01R 33/028* (2006.01)

(52) U.S. Cl.
CPC .......... *H01F 21/06* (2013.01); *G01D 5/2291* (2013.01); *G01R 33/028* (2013.01)

(58) Field of Classification Search
CPC ........ H01F 21/06; H01F 21/065; H01F 27/28; H01F 27/24; H01F 29/08; H01F 29/10; G01D 5/2291; G01R 33/028

USPC ............................ 336/45, 130–132; 318/657
See application file for complete search history.

(56) References Cited

U.S. PATENT DOCUMENTS

| | | | | |
|---|---|---|---|---|
| 4,667,158 | A | * | 5/1987 | Redlich ............... G01D 5/2026 324/207.19 |
| 4,694,246 | A | * | 9/1987 | Avisse ................... H01F 38/22 324/207.18 |
| 4,808,958 | A | | 2/1989 | Hewitt et al. |
| 5,061,896 | A | | 10/1991 | Schmidt |
| 7,317,371 | B1 | * | 1/2008 | Carroll ................ G01D 5/2291 336/130 |
| 8,264,315 | B2 | | 9/2012 | Fox et al. |
| 2016/0033306 | A1 | * | 2/2016 | Hubbell .............. G01D 5/2291 244/76 R |

* cited by examiner

*Primary Examiner* — Mang Tin Bik Lian
(74) *Attorney, Agent, or Firm* — Craige Thompson; Thompson Patent Law; Vincent Musgrove

(57) ABSTRACT

A linear variable displacement transformer (LVDT) position sensor. The position sensor comprises a bobbin, a primary coil of wire wound on the bobbin, a first secondary coil wound in stepped layers on the bobbin, and a second secondary coil wound in stepped layers on the bobbin. The first secondary coil comprises a plurality of booster windings at an end of the first secondary coil. The second secondary coil comprises a plurality of booster windings at an end of the second secondary coil opposite the end of the first secondary coil booster windings. The stepped windings of the second secondary coil are complementary to the stepped windings of the first secondary coil.

19 Claims, 2 Drawing Sheets

LINEAR VARIABLE DISPLACEMENT TRANSFORMER (LVDT) WITH IMPROVED LINEARITY USING EXTREME END BOOSTER WINDING

CROSS-REFERENCE TO RELATED APPLICATIONS

None.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Linear variable displacement transformer (LVDT) position sensors comprise a primary transformer coil winding and two secondary transformer coil windings wound on a common axis. As the primary transformer winding is excited with an alternating current (AC) voltage signal, it generates a magnetic field that couples into the two secondary transformer windings, establishing an AC voltage signal across the two secondary windings. A moveable core that is free to move linearly along the common axis of the windings affects the amount of magnetic coupling between the primary windings and each of the secondary windings. The moveable core is attached to a rod that is itself attached to some mechanical structure whose position is desired to be determined by the LDVT position sensor. As the moveable core moves in one direction or another, the coupling from the primary winding to the secondary windings changes, and an indication of the position is provided by the outputs of the secondary windings.

SUMMARY

In an embodiment, a linear variable displacement transformer (LVDT) position sensor is disclosed. The position sensor comprises a bobbin, a primary coil of wire wound on the bobbin, a first secondary coil wound in stepped layers on the bobbin, and a second secondary coil wound in stepped layers on the bobbin. The first secondary coil comprises a plurality of booster windings at an end of the first secondary coil. The second secondary coil comprises a plurality of booster windings at an end of the second secondary coil. The stepped windings of the second secondary coil are complementary to the stepped windings of the first secondary coil.

In another embodiment, a linear variable displacement transformer (LVDT) position sensor is disclosed. The position sensor comprises a bobbin, a primary coil comprising wire wound on the bobbin, a first stepped secondary coil comprising wire wound on the bobbin, and a second stepped secondary coil comprising wire wound on the bobbin. A first end of the first stepped secondary coil comprises more turns of wire than a second end of the first stepped secondary coil, and the first stepped secondary coil comprises a plurality of booster windings at the first end of the first stepped secondary coil. A first end of the second stepped secondary coil comprises fewer turns of wire than a second end of the second stepped secondary coil. The second stepped secondary coil comprises a plurality of booster windings at the second end of the second stepped secondary coil. The first end of the first stepped secondary coil is proximate to the first end of the second stepped secondary coil, and the second end of the first stepped secondary coil is proximate to the second end of the second stepped secondary coil.

In yet another embodiment, a linear variable displacement transformer (LVDT) position sensor is disclosed. The position sensor comprises a bobbin, a moveable core, and a primary coil of wire wound on the bobbin. The position sensor further comprises a first secondary coil wound in stepped layers on the bobbin and comprising a plurality of booster windings at an end 20% of the first secondary coil and a second secondary coil wound in stepped layers on the bobbin and comprising a plurality of booster windings at an end 20% of the second secondary coil opposite the end of the first secondary coil booster windings, where the stepped windings of the second secondary coil are complementary to the stepped windings of the first secondary coil.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
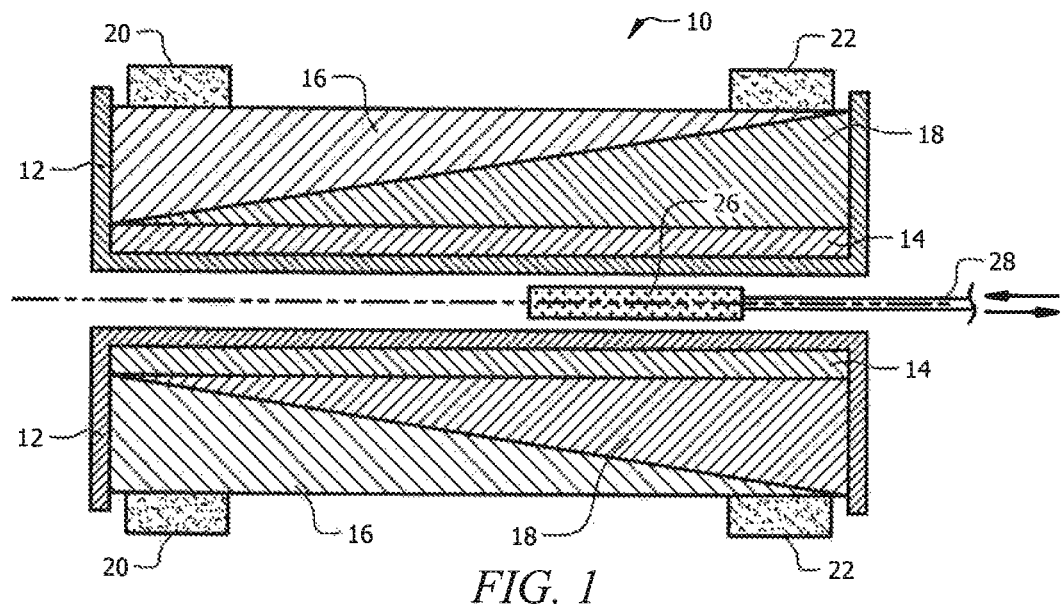
FIG. 1 is an illustration of a linear variable displacement transducer position sensor according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The present disclosure teaches a linear variable displacement transformer (LVDT) position sensor with stepped complementary secondary coils that each has booster windings at one end. These booster windings can compensate for end effects of the coupling between the primary coil and the two secondary coils so as to extend the linear transducing range of the LVDT by as much as 20% and at the same time increase the accuracy of the LVDT over the entire transducing range. The effect of the booster windings may be conceptualized as compensating a voltage versus voltage (V/V) curve of the LVDT by making the curve more linear in an already linear portion of the curve and extending the linear range.

An LVDT may comprise secondary coils that are step wound such that a first end of a first secondary coil has more winding turns than a second end of the first secondary coil, and a first end of a second secondary coil has fewer winding turns than a second end of the second secondary coil, where the first ends of each secondary coil overlay and the second ends of each secondary coil overlay. The stepping of the windings taper each of the secondary coils but in opposite directions. A secondary coil winding may comprise a plurality of steps, where the number of winding loops or turns within each step is different from the number of winding loops in the other steps of that secondary coil. The number of winding loops in each step may increase monotonically from one end of the secondary coil to the opposite end of the secondary coil. In an embodiment, the number of winding loops in adjacent steps may differ by a constant value or by a constant delta. Thus, a second step of a secondary coil may comprise 60 more turns than a first step of the same secondary coil; a third step of the secondary coil may comprise 60 more turns than the second step of the same secondary coil; a fourth step of the secondary coil may comprise 60 more turns than the third step of the secondary coil; and so forth. This monotonically increasing number of winding loops or turns in a secondary coil may be said to produce a tapered secondary coil. A conventional tapering scheme of secondary coils in a LVDT position sensor features a constant delta number of turns between each adjacent step including the steps at the extremes of the secondary coil.

The present disclosure teaches adding a booster winding at one extreme or end of each secondary coil, where the booster winding breaks the pattern of increasing a constant delta number of windings between adjacent steps of the secondary coil. The booster winding is added at the end of the secondary coil that has the most number of turns. A booster winding is added to both the first secondary coil and the second secondary coil. Because the taper of the first and second secondary coils are tapered in opposite directions, the booster winding of the first secondary coil is at a first end of the LVDT, and the booster winding of the second secondary coil is at a second end of the LVDT, opposite to the first end of the LVDT. These relationships will be more clearly understood with reference to figures as described below.

Turning now to FIG. 1, a linear variable displacement transformer (LVDT) position sensor 10 is described. In an embodiment, the LVDT position sensor 10 comprises a bobbin 12, a primary coil 14, a first secondary coil 16, a second secondary coil 18, first booster windings 20, and second booster windings 22. In an embodiment, the LVDT position sensor 10 further comprises a moveable core 26 coupled to a connecting rod 28. It is understood that in some embodiments, the LVDT position sensor 10 may be provided as a package or product that does not include the moveable core 26 and the connecting rod 28. Alternatively, in some embodiments, the LVDT position sensor 10 may be provided as a package or product that does include the moveable core 26 and the connecting rod 28. As known by one skilled in the art, electrical coils comprise a plurality of turns of conducting wire. In the LVDT position sensor 10, the primary coil 14, the secondary coils 16, 18, and the booster windings 20, 22 are wound on the bobbin 12 that serves as a mechanical structure for the winding of turns of conducting wire.

The first secondary coil 16 and the second secondary coil 18 are both taper wound, but tapered in opposite senses. Thus, as illustrated, a left end of the first secondary coil 16 has more winding turns than a right end of the first secondary coil 16 and is tapered left to right; while a right end of the second secondary coil 18 has more winding turns than a left end of the second secondary coil 18 and is tapered right to left. In an embodiment, the tapering of the secondary coils 16, 18 is accomplished by varying the spacing between the turns of the windings from one end to the opposite end of the bobbin 12. The spacing between turns may be changed by constant amounts over each of a plurality of segments of the secondary coils 16, 18. The different spacing between turns in the different segments of the secondary coils 16, 18 may be said to define the secondary coils 16, 18 as stepped secondary coils. While the taper of the secondary coils 16, 18 is illustrated as varying in thickness continuously from one end to another (in different senses for the first secondary coil 16 versus the second secondary coil 18), in an embodiment, the number of turns over different segments of the secondary coils 16, 18 vary not continuously but rather in discrete steps. Additionally, as discussed further hereinafter, the windings of the secondary coils 16, 18 may be commingled as they are each wound in four layers using a crisscross winding technique.

The first booster windings 20 are electrically part of and a continuation of the first secondary coil 16 located at the extreme left end of the first secondary coil 16. The second booster windings 22 are electrically part of and a continuation of the second secondary coil 18 located at the extreme right end of the second secondary coil 18. Said in other words, the first secondary coil 16 and the first booster windings 20 form a third secondary coil, and the second secondary coil 18 and the second booster windings 22 form a fourth secondary coil.

When installed for use in a typical electromechanical system, the LVDT position sensor 10 provides an indication of a position of a structure that is coupled to the connecting rod 28. Examples of aerospace applications of LVDT position sensors include use in flight control actuators, nose wheel steering systems, cockpit controls, engine bleed air systems, fuel controls, fly-by-wire systems, brake-by-wire systems, and environmental control systems. LVDT position sensors may be used in power turbine applications. LVDT position sensors can provide high repeatability and reliability.

In use, an excitation signal is applied to the primary coil 14 that generates a magnetic field that couples into the secondary coils 16, 18 and the booster windings 20, 22 and induces a response at the terminal or terminals of the coils 16, 18 and/or the booster windings 20, 22. For example, an alternating current (AC) voltage is applied to the primary coil 14 by an external circuit (not shown). The coupling between the primary coil 14 and the secondary coils 16, 18 and the booster windings 20, 22 are modified by the position of the moveable core 26. The moveable core 26 comprises a material that has relatively high magnetic permeability, such as ferro-magnetic materials. The moveable core 26 may comprise alloys of iron, nickel, cobalt, manganese, chromium, molybdenum, and/or combinations thereof. The moveable core 26 may comprise permalloy and/or mu-metal.

Not wishing to be bound by theory, because the secondary coils 16, 18 are tapered in opposite directions, the moveable core 26 couples the magnetic field generated by the primary coil 14 into the secondary coils 16, 18 and booster windings 20, 22 differentially. Said in other words, the voltage induced in the first secondary coil 16 and first booster windings 20 is greater when the moveable core 26 is displaced to the left of center and less when the moveable core 26 is displaced to the right of center. Likewise, but in opposite sense, the voltage induced in the second secondary coil 18 and second booster windings 22 is less when the moveable core 26 is displaced to the left of center and greater when the moveable core 26 is displaced to the right of center. The change in the voltages induced in the coils 16, 18 and booster windings 20, 22 may be analyzed by external circuitry (not shown) to determine a position of the moveable core 26 and hence to determine a position of a mechanical structure coupled by the connecting rod 28 to the moveable core 26.

The first secondary coil 16 and the second secondary coil 18 are uniformly tapered, that is the number of turns of windings forming the secondary coil increases by a constant delta from a first end to a second end. The first booster windings 20 connected to the first secondary coil 16, however, make the extreme left end of the third coil (i.e., the combination of the first secondary coil 16 and the first booster windings 20) non-uniformly tapered at its extreme left end. The second booster windings 22 connected to the second secondary coil 18, likewise, make the extreme right end of the fourth coil (i.e., the combination of the second secondary coil 18 and the second booster windings 22) non-uniformly tapered at its extreme right end.

The non-uniform taper of the third coil at its extreme left end adapts a response of the third coil to keep the position indication output of the third coil linear with position of the moveable core 26 further or over a greater range of displacement than the first secondary coil 16 without the inclusion of the first booster windings 20. Without wishing to be bound by theory, it is thought that the addition of the first booster windings 20 corrects an error in the indication of position provided by the first secondary coil 16 in isolation that results from magnetic coupling edge effects when the moveable core 26 is displaced towards the left side. In a complementary manner, the non-uniform taper of the fourth coil at its extreme right end adapts a response of the fourth coil to keep the position indication output of the fourth coil linear with position of the moveable core 26 further or over a greater range of displacement than the second secondary coil 18 without the inclusion of the second booster windings 22. In some contexts, the profile of windings of the first secondary coil 16 combined with the first booster windings 20 may be said to be complementary to the profile of windings of the second secondary coil 18 combined with the second booster windings 22, in that the tapering of the third coil (the combination of the first secondary coil 16 and the first booster windings 20) is similar in profile but opposite in sense to the tapering of the fourth coil (the combination of the second secondary coil 18 and the second booster windings 22).

In an embodiment, the first booster windings 20 are provided in a 20% portion of the first secondary coil 16 on its left end; and the second booster windings 22 are provided in a 20% portion of the second secondary coil 18 on its right end. In another embodiment, the first booster windings 20 are provided in a 15% portion of the first secondary coil 16 on its left end; and the second booster windings 22 are provided in a 15% portion of the second secondary coil 18 on its right end. In another embodiment, the first booster windings 20 are provided in a 10% portion of the first secondary coil 16 on its left end; and the second booster windings 22 are provided in a 10% portion of the second secondary coil 18 on its right end.

The use of booster windings at the extreme ends of the secondary coils in the LVDT position sensor 10 can be conceived to extend the linear transducing range of a sensor or, alternatively, to reduce the size of a sensor. The LVDT position sensor 10 may also increase the accuracy of the position sensing across the entire range of the transducer relative to a LVDT position sensor having uniformly tapered secondary coils.

Figure 2:
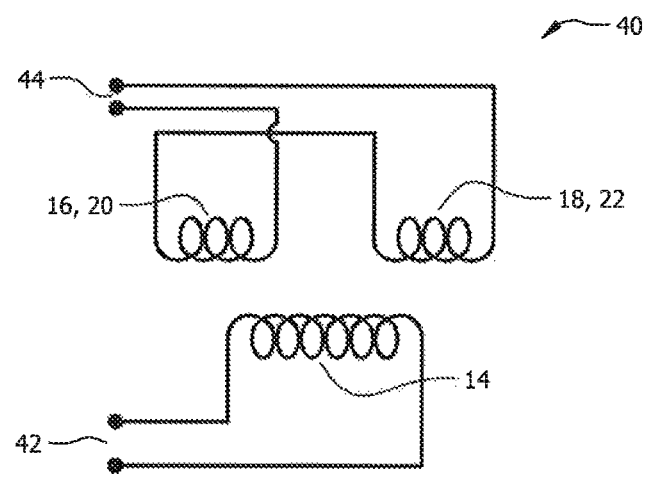
FIG. 2 is an electrical schematic of a linear variable displacement transducer position sensor according to an embodiment of the disclosure.

Turning now to FIG. 2, an electrical schematic 40 of the LVDT position sensor 10 is described. The electrical schematic 40 comprises the primary coil 14 having first terminal 42; the first secondary coil 16 and the first booster windings 20 (the third coil) and the second secondary coil 18 and the second booster windings 22 (the fourth coil) having second terminal 44. In an embodiment, the secondary coils 16, 18 and booster windings 20, 22 may have different terminations; for example, a center tap where the third coil and the fourth coil connect. When the first terminal 42 is stimulated with an appropriate AC excitation voltage, the voltage in the second terminal 44 provides an indication of a position of the moveable core 26.

Figure 3:
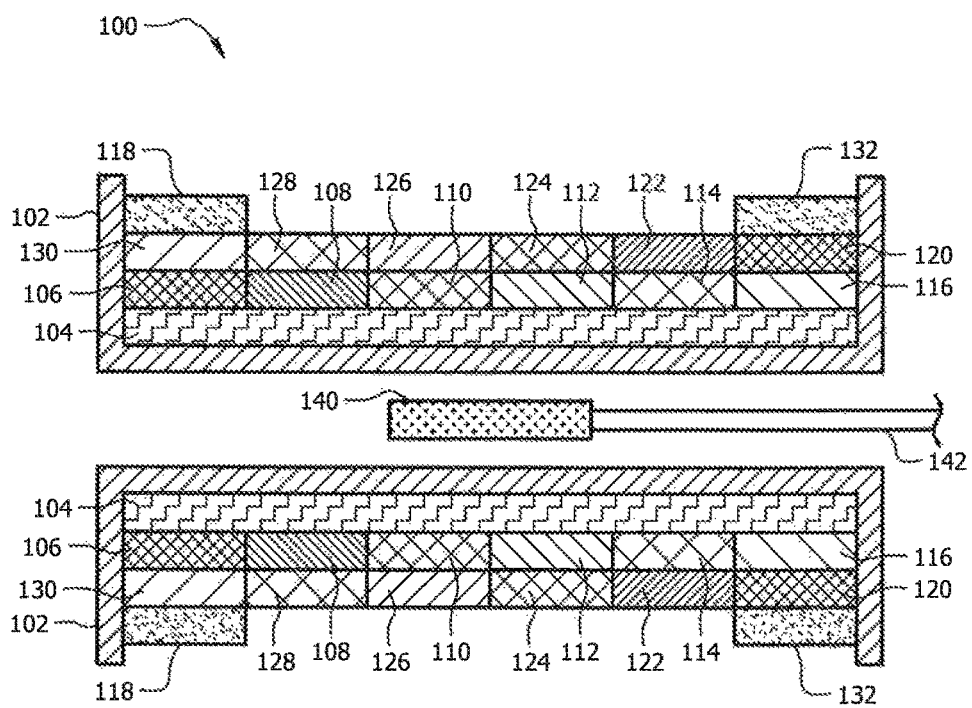
FIG. 3 is an illustration of a linear variable displacement transducer position sensor having complementary stepped secondary windings according to an embodiment of the disclosure.

Turning now to FIG. 3, a second LVDT position sensor 100 is described. In an embodiment, the second LVDT position sensor 100 comprises stepped secondary windings. In an embodiment, the second LVDT position sensor 100 comprises a bobbin 102, a primary coil 104, a first secondary coil, a second secondary coil, a first booster winding 118, and a second booster winding 132. The first secondary coil comprises a plurality of stepped winding segments; for example, a first secondary coil first segment 106, a first secondary coil second segment 108, a first secondary coil third segment 110, a first secondary coil fourth segment 112, a first secondary coil fifth segment 114, and a first secondary coil sixth segment 116. The second secondary coil comprises a plurality of stepped winding segments; for example, a second secondary coil first segment 120, a second secondary coil second segment 122, a second secondary coil third segment 124, a second secondary coil fourth segment 126, a second secondary coil fifth segment 128, and a second secondary coil sixth segment 130. The secondary coil segments may also be referred to as steps.

It is understood that in different embodiments, the first and secondary coils may comprise a different number of winding segments; for example, each secondary coil comprising 3 winding segments, each secondary coil comprising 4 winding segments, each secondary coil comprising 5 winding segments, each secondary coil comprising 10 winding segments, or each secondary coil comprising some other number of winding segments. Said in a different way, in different embodiments, the secondary coils may comprise at least 3 steps, at least 4 steps, at least 5 steps, at least 6 steps, at least 10 steps, or some other number of steps. In an embodiment, the first secondary coil and the first booster winding 118 are formed of a first continuous length of wire, and the second secondary coil and the second booster winding 132 are formed of a second continuous length of wire. In another embodiment, however, the coils and windings may be made from connected multiple segments of wire. The number of turns in each winding segment is varied by varying the space between windings. It is the different number of turns in each different winding segment which is referred to as stepping or stepped.

In an embodiment, the first secondary winding is wound by winding in a first layer left to right, a second layer from right to left, a third layer from left to right, and a fourth and final layer from right to left. In an embodiment, the second secondary winding is wound by winding in a first layer right to left, a second layer from left to right, a third layer from right to left, and a fourth and final layer from left to right. In each layer, the spacing of the windings is varied to produce a desired taper and/or stepped number of turns in the subject segment. In an embodiment, the secondary coils are wound using a crisscross technique. The winding of the first booster windings 118 may be completed after the first secondary winding segments 106-116 have been wound, and the second booster windings 132 may be completed after the second secondary winding segments 120-130 have been wound. Alternatively, the booster windings 118, 132 may be established by increasing the number of windings in the appropriate step or segment of the secondary windings; for example, by decreasing the spacing between turns in the first secondary coil first segment 106 and by decreasing the spacing between turns in the second secondary coil first segment 120, whereby to provide a surplus number of turns in the associated secondary coils relative to a uniform taper configuration. It is understood that the windings of the first secondary coil and the second secondary coil will be intermingled and not vertically separated as illustrated in FIG. 3. The vertical layering of secondary coils in FIG. 3 is thought to promote improved understandability of the construction of the LVDT position sensor 100.

As an example, the primary coil 104 may comprise 2500 turns, the first secondary coil may comprise 900 turns, the second secondary coil may comprise 900 turns, the first booster winding 118 may comprise 50 turns, and the second booster winding 132 may comprise 50 turns. The first secondary coil first segment 106 comprises 300 turns, the first secondary coil second segment 108 comprises 240 turns, the first secondary coil third segment 110 comprises 180 turns, the first secondary coil fourth segment 112 comprises 120 turns, the first secondary coil fifth segment 114 comprises 60 turns, and the first secondary coil sixth segment 116 comprises zero turns or one turn. The second secondary coil first segment 120 comprises 300 turns, the second secondary coil second segment 122 comprises 240 turns, the second secondary coil third segment 124 comprises 180 turns, the second secondary coil fourth segment 126 comprises 120 turns, the second secondary coil fifth segment 128 comprises 60 turns, and the second secondary coil sixth segment 130 comprises zero turns or one turn. It will be appreciated that this configuration is provided for the sake of example and that the teachings of the present disclosure are applicable to a wide range of different configurations. It is understood that the booster windings are added to each extreme end of its corresponding secondary winding and constitutes an excess of windings or an increase of windings of at least 10%, of at least 15%, or of at least 20% relative to the extreme end winding segment with reference to a uniform taper and/or with reference to a constant delta of number of turns per segment. In an embodiment, the primary coil 104, the first secondary coil, and the second secondary coil may each be about 2.4 inches in length, the moveable core 140 may be about 1.3 inches long, and the stroke of the moveable core 140 may be about 1 inch. The moveable core 140 may be mechanically coupled to an external structure by the connecting rod 142.

A use may comprise the following steps. Step one, applying an excitation voltage to the primary coil, whereby the primary coil establishes a time varying magnetic field that links with the first secondary coil and the second secondary coil. Step two, locating the core in the center of the turns of the primary coil, the turns of the first secondary coil, and the turns of the second secondary coil (the coils are wound on a common axis or center, for example on the bobbin). Step three, outputting a response voltage from the first secondary coil and the second secondary coil in response to the time varying magnetic field that links from the primary coil. Step four, processing the output of the secondary coils to determine a linear position of the core. It is observed, as the core moves linearly in the center of the primary and secondary coils, the core alters the magnetic coupling from the primary coil to the secondary coils. Because the secondary coils are stepped and/or tapered, the magnetic coupling to the first coil is different from the magnetic coupling to the second coil when the core is displaced from a centered or neutral position. Because of the presence of booster windings on each of the extremes of the secondary coils, the range of linear response of the sensor is extended relative to the linear response range of a conventional (e.g., prior art) linear variable displacement transformer of like length. It is understood that the steps of this method may be iterated or repeated. In an embodiment, the steps of the method are iterated many times per second, for example more than about 30 times per second, more than about 100 times per second, more than about 200 times per second, more than about 1000 times per second, or some other number of iterations per second. Some steps may be substantially continuous, for example the processing of step one, step two, and step three may be regarded as continuous. It is understood that this method may be employed with either of the LVDT position sensor 10 described above with reference to FIG. 1 or the second LVDT position sensor 100 described above with reference to FIG. 3.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is clamed is:

1. A linear variable displacement transformer (LVDT) position sensor, comprising:
   a bobbin;
   a primary coil of wire wound on the bobbin;
   a first secondary coil comprising:
      a plurality of discrete first secondary coil stepped winding segments, wherein a respective number of turns for each segment in the plurality of discrete first secondary coil stepped winding segments monotonically decreases going from a first end of the first secondary coil to a second end of the first secondary coil; and,
      a first booster winding at an end of the first secondary coil; and
   a second secondary coil comprising:
      a plurality of discrete second secondary coil stepped winding segments, wherein a respective number of turns for each segment in the plurality of discrete second secondary coil stepped winding segments monotonically increases going from a first end of the second secondary coil to a second end of the second secondary coil, and,
a second booster winding at an end of the second secondary coil opposite the end of the first booster winding, where the stepped winding segments of the second secondary coil are complementary to the stepped winding segments of the first secondary coil,
wherein the booster windings of the first secondary coil are located in the outer 10% of the end of the first secondary coil and the booster windings of the second secondary coil are located in the outer 10% of the opposite end of the second secondary coil.

2. The linear variable displacement transformer position sensor of claim 1, wherein the first booster winding at the end of the first secondary coil increases the number of turns of a coil step at the end of the first secondary coil by at least 10% and the second booster winding at the end of the second secondary coil increases the number of turns of a coil step at the end of the second secondary coil by at least 10%.

3. The linear variable displacement transformer position sensor of claim 1, wherein the first booster winding of the first secondary coil are located within the outer 20% of the end of the first secondary coil and the second booster winding of the second secondary coil are located within the outer 20% of the opposite end of the second secondary coil.

4. The linear variable displacement transformer position sensor of claim 1, further comprising a moveable core that is configured to couple a magnetic field generated by the primary coil into the first secondary coil and the second secondary coil, where the magnetic field is generated by the primary coil when it is excited by an alternating current (AC) voltage.

5. The linear variable displacement transformer position sensor of claim 4, wherein the moveable core couples the magnetic field generated by the primary coil into the secondary coils differentially based on a location of the moveable core.

6. The linear variable displacement transformer position sensor of claim 4, wherein the moveable core comprises a ferrous metal.

7. The linear variable displacement transformer position sensor of claim 4, wherein the moveable core comprises one of permalloy or mu-metal.

8. The LVDT position sensor of claim 1, wherein the number of turns in each winding segment is varied by varying the space between windings.

9. A linear variable displacement transformer (LVDT) position sensor, comprising:
a bobbin;
a primary coil comprising wire wound on the bobbin;
a first stepped secondary coil wound on the bobbin comprising:
a plurality of discrete first secondary coil stepped winding segments, wherein a respective number of turns for each segment in the plurality of discrete first secondary coil stepped winding segments monotonically decreases going from a first end of the first stepped secondary coil to a second end of the first stepped secondary coil; and,
a first booster winding at the first end of the first stepped secondary coil; and
a second stepped secondary coil wound on the bobbin comprising:
a plurality of discrete second secondary coil stepped winding segments, wherein a respective number of turns for each segment in the plurality of discrete second secondary coil stepped winding segments monotonically increases going from a first end of the second stepped secondary coil to a second end of the second stepped secondary coil, and,
a second booster winding at the second end of the second stepped secondary coil,
wherein the first end of the first stepped secondary coil is proximate to the first end of the second stepped secondary coil and the second end of the first stepped secondary coil is proximate to the second end of the second stepped secondary coil,
wherein the booster windings of the first stepped secondary coil are located in the outer 10% of the end of the first secondary coil and the booster windings of the second secondary coil are located in the outer 10% of the opposite end of the second secondary coil.

10. The linear variable displacement transformer position sensor of claim 9, further comprising a moveable core.

11. The linear variable displacement transformer position sensor of claim 9, further comprising a moveable core comprised of one of permalloy or mu-metal.

12. The LVDT position sensor of claim 9, wherein:
the plurality of discrete first secondary coil stepped winding segments comprises:
a first segment comprising 300 turns;
a second segment comprising 240 turns;
a third segment comprising 180 turns;
a fourth segment comprising 120 turns;
a fifth segment comprising 60 turns; and,
a sixth segment comprising a single turn; and,
the plurality of discrete second secondary coil stepped winding segments comprises:
a seventh segment comprising 300 turns;
an eighth segment comprising 240 turns;
a ninth segment comprising 180 turns;
a tenth segment comprising 120 turns;
an eleventh segment comprising 60 turns; and,
a twelfth segment comprising a single turn.

13. The LVDT position sensor of claim 9, wherein each segment in the plurality of discrete first secondary coil stepped winding segments is directly adjacent to another segment in the plurality of discrete first secondary coil winding segments, and each segment in the plurality of discrete second secondary coil stepped winding segments is directly adjacent to another segment in the plurality of discrete first secondary coil stepped winding segments.

14. A linear variable displacement transformer (LVDT) position sensor, comprising:
a bobbin;
a moveable core;
a primary coil of wire wound on the bobbin;
a first secondary coil wound in a stepped windings configuration on the bobbin and comprising:
a plurality of discrete first secondary coil stepped winding segments, wherein a respective number of turns for each segment in the plurality of discrete first secondary coil stepped winding segments monotonically decreases going from a first end of the first secondary coil to a second end of the first secondary coil; and,
a first booster winding within the outer 10% to 20% of the first secondary coil; and
a second secondary coil wound in a stepped windings configuration on the bobbin and comprising:
a plurality of discrete second secondary coil stepped winding segments, wherein a respective number of turns for each segment in the plurality of discrete second secondary coil stepped winding segments monotonically increases going from a first end of the second secondary coil to a second end of the second secondary coil, and, a second booster winding within the outer 10% to 20% of the second secondary coil opposite the end of the first secondary coil, wherein the stepped winding segments of the second secondary coil are complementary to the stepped winding segments of the first secondary coil.

15. The linear variable displacement transformer (LVDT) position sensor of claim 14, wherein the moveable core comprises one or more of an alloy of iron, nickel, cobalt, manganese, chromium, or molybdenum.

16. The linear variable displacement transformer (LVDT) position sensor of claim 14, where the moveable core is formed from one of permalloy or mu-metal.

17. The linear variable displacement transformer (LVDT) position sensor of claim 14, wherein the first booster winding on the first secondary coil increase the number of turns at the end of the first secondary coil by at least 10% and the second booster winding on the second secondary coil increase the number of turns at the end of the second secondary coil by at least 10%.

18. The LVDT position sensor of claim 13, wherein each segment in the plurality of discrete first secondary coil stepped winding segments is entirely enclosed by a corresponding segment in the plurality of discrete second secondary coil stepped winding segments.

19. The LVDT position sensor of claim 18, wherein the primary winding extends continuously across a longitudinal length of the bobbin and the primary winding is entirely enclosed by the first secondary coil.

* * * * *